United States Patent
Rodrigues

(10) Patent No.: US 6,921,273 B2
(45) Date of Patent: Jul. 26, 2005

(54) ELECTRIC CONNECTION ARRANGEMENT FOR ELECTRONIC DEVICES

(75) Inventor: Julio Cesar Rodrigues, Joinville-SC (BR)

(73) Assignee: Empresa Brasileira de Compressores S.A. - Embarco, Joinville-SC (BR)

( * ) Notice: Subject to any disclaimer, the term of this patent is extended or adjusted under 35 U.S.C. 154(b) by 0 days.

(21) Appl. No.: 10/481,968
(22) PCT Filed: Jun. 12, 2002
(86) PCT No.: PCT/BR02/00082
§ 371 (c)(1), (2), (4) Date: Feb. 24, 2004
(87) PCT Pub. No.: WO02/104089
PCT Pub. Date: Dec. 27, 2002

(65) Prior Publication Data
US 2004/0147142 A1 Jul. 29, 2004

(30) Foreign Application Priority Data
Jun. 18, 2001 (BR) .............................. 0103370

(51) Int. Cl.⁷ .............................................. H01R 9/09
(52) U.S. Cl. ...................................................... 439/76
(58) Field of Search ..................... 439/76, 630, 637, 439/485, 487, 704, 707, 687

(56) References Cited

U.S. PATENT DOCUMENTS 4,082,407 A  *  4/1978  Smorzaniuk et al. ....... 439/487

FOREIGN PATENT DOCUMENTS

| DE | 42 40 754 A1 | 6/1994 |
| DE | 42 42 943 A1 | 6/1994 |
| DE | 44 22 114 A1 | 1/1996 |

* cited by examiner

Primary Examiner—Gary Paumen
Assistant Examiner—Phuongchi Nguyen
(74) Attorney, Agent, or Firm—Darby & Darby

(57) ABSTRACT

An electric connection arrangement for electronic devices of the type comprising a printed circuit board (11) carrying at least one electronic component (12, 13, 14, 15) and at least two binding posts (12a, 16) to be electrically connected to an external system that will be operatively associated with the electronic device (10). The electric connection arrangement comprises a housing (20) made of a non-conducting material that is internally provided with contact elements (21, 25) electrically coupled to the external system and which are to be seated, each one to a respective binding post (12a, 16) of the electronic device (10), when the latter is fitted into the housing (20), at least one of said contact elements (21) being seated, by elastic deformation, against the respective binding post (12a, 16) of the electronic device (10).

9 Claims, 2 Drawing Sheets

ELECTRIC CONNECTION ARRANGEMENT FOR ELECTRONIC DEVICES

FIELD OF THE INVENTION

The present invention refers to a constructive arrangement to provide a novel electric connection between the electronic devices formed on a printed circuit board and an external system to be operatively connected to the electronic device.

PRIOR ART

There is well known from the prior art the electronic devices formed on a base defined by a printed circuit board usually consisting of a structural substract made of an electric insulating material and onto which is deposited a thin conductive layer made of copper. These printed circuit boards may have one or more conductive layers, but in case of multiple conductive layers, the latter are connected to each other by means of metallized bores provided in the structural substract.

Known industrial processes, by eliminating certain regions from the conductive layer, generate connection conditions between the electronic components that will be later welded to the printed circuit board, with the objective of completing the circuit of the electronic device formed in conjunction with said plate. The electronic components can be welded either to one or to both faces of the plate.

Nevertheless, the electronic devices thus formed, by joining a printed circuit board with at least one electronic component, are required to be electrically connected or coupled to an external system to which they are operatively associated, which system can take different forms, such as electric motors, solenoid valves, transformers, etc.

These electronic devices may further contain a power electronic component generating heat, which has to be dissipated or conducted to the exterior.

Generally these components are constructed on metallic bases that have the function of thermically coupling the component with heat radiating surfaces. However, in most cases, these metallic bases are electrically connected to one of the terminals of the component, whereby they have the double function of operating both as a thermal and a conducting means.

However, the known solutions usually applied for providing an electric connection between the electronic devices of the type considered herein and the external elements present manufacture and assembly that are very complex, expensive and subject to mistakes, requiring a large number of components and correspondingly increased dimensions for the printed circuit board, as well as numerous and precise operations for establishing the desired electric connections. One of the known prior art solutions uses connectors, which need to be mounted on the printed circuit board by being directly welded to the latter, screwed thereon, or press fitted into metallized bores of the printed circuit board. The first two assembly options require laborious operations that make difficult to achieve a sufficiently reliable production, while the third solution requires the provision of metallic bores in the printed circuit board, increasing the cost to produce the latter and providing low mechanical stability to the connection. Besides the inconveniences above, such prior art connectors often require their connection to conductors that are coupled to any external system, requiring an additional step in the production or assembly processes.

Another known solution uses the so-called edge connectors, in which case a portion of the marginal surface of the printed circuit board is used as a terminal element for electric connection into a slot of a receiving means. In this case, the printed circuit board has to be necessarily constructed with its edge defining the element for electrical connection to another receiving means.

Where the electronic device presents a power electronic component, the heat dissipation from the latter is generally achieved by one of the three forms described hereinafter. In the first form, the electronic component is screwed to the heat-radiating surface, which is normally a piece made of aluminum or copper. In a second modality, the electronic component is secured through clamps or springs to the heat-radiating surface. In a third known form, the fixation of the power electronic component is achieved by means of rivets applied to the heat-radiating surface. In all said constructions, it is required the provision of additional fixing means, which besides increasing the number of components of the device, require production and assembly operations that are relatively complex and subject to deviations from the adequate reliability patterns.

OBJECTS OF THE INVENTION

An object of the present invention is to provide an electric connection arrangement between an electronic device of the type considered herein and an external system, presenting a reduced number of components with a consequent reduction of the dimensions of the printed circuit board, of the production and assembly operations of the related elements, and of the final cost, not only of the printed circuit board but also of the final assembly after the electric connection has been carried out.

A further object of the present invention is to provide an electric connection arrangement as mentioned above, which facilitates the coupling operation of the electronic device with a connection receiving means, allowing a fast and automated assembly.

Still a further object of the invention is to provide an electric connection arrangement as mentioned above, which allows the use of heat radiating surfaces and of the power electronic components, if present, as binding posts to be electrically connected to the external system which will be operatively coupled to the electronic device.

SUMMARY OF THE INVENTION

The electric connection arrangement of the present invention is directed to electronic devices formed by a printed circuit board having a simple or double face and carrying at least one electronic component and at least two binding posts to be electrically connected to an external system that will be operatively associated with the electronic device and which can take different forms. The present arrangement comprises a housing made of a non-conducting material that is internally provided with contact elements electrically coupled to the external system and which are to be seated, each one to a respective binding post of the electronic device, when the latter is fitted into the housing, at least one of said contact elements being seated, by elastic deformation, against the respective binding post of the electronic device.

BRIEF DESCRIPTION OF THE DRAWINGS

Other objects and advantages of the present invention will become more apparent with reference being made to the attached drawings, in which.

DETAILED DESCRIPTION OF THE INVENTION

Figure 1:
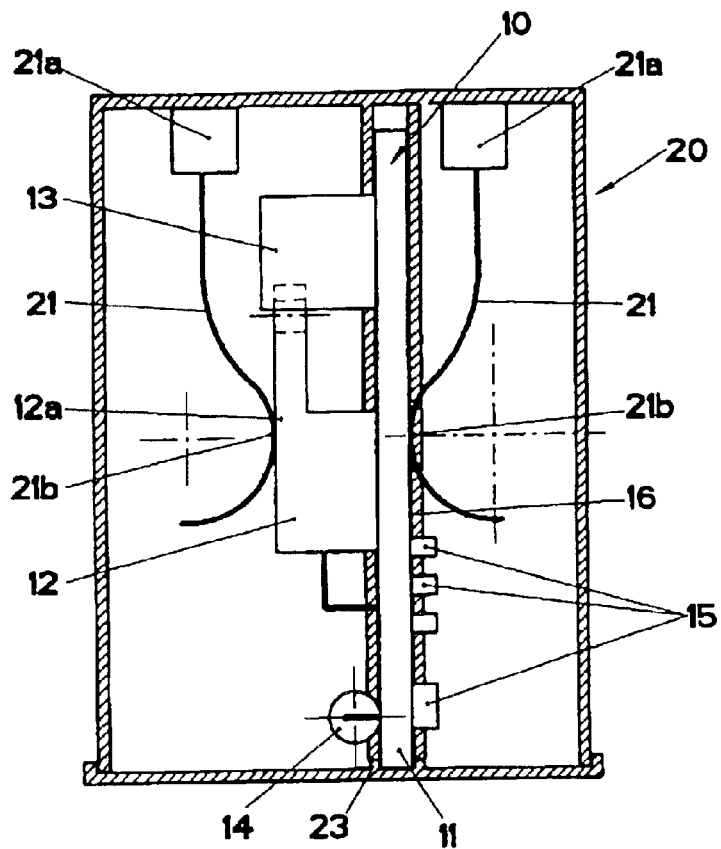
FIG. 1 is a schematic longitudinal sectional view of the electric connection arrangement according to an embodiment of the present invention.

As illustrated in the figures of the drawings, the electric connection arrangement in question is directed to an electronic device 10 of the type comprising a printed circuit board 11 with a simple or double face, onto which are affixed, by any adequate process, electronic components 12, 13, 14, 15, which are defined according to the design of the electronic circuit to be formed.

In the illustrated embodiments, one of the electronic components has the form of a power electronic component 12 presenting an external surface 12a of heat dissipation, which is electronically coupled to one of the terminals of said power electronic component 12 and lying on a plane that is usually parallel to the printed circuit board 11. However, it should be understood that the electronic components may take different forms, incorporating or not a surface that defines a respective binding post of the electronic device.

Figure 1A:
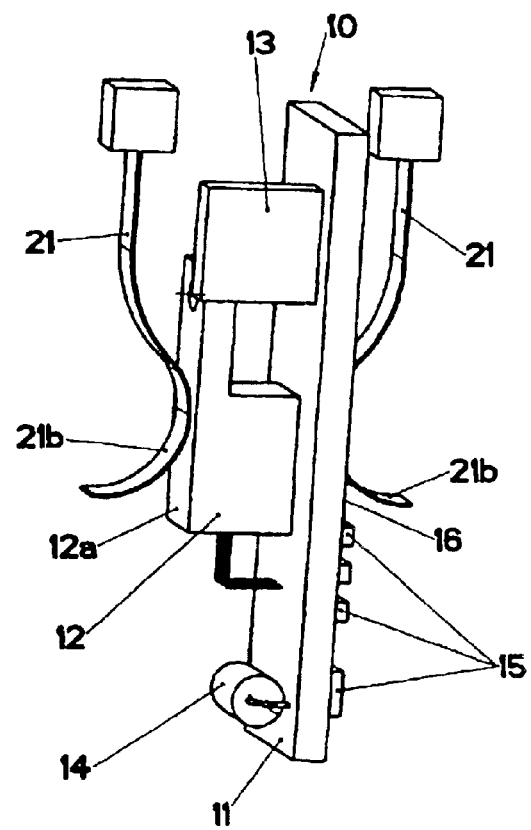
FIG. 1a is a complete perspective view of the electronic device illustrated in FIG. 1 and a partial perspective view of the pair of contact elements of the housing.

In the embodiment illustrated in FIGS. 1 and 1a, the electronic device 10 presents a binding post defined by the external surface 12a itself, which dissipates heat from the power electronic component 12 on one of the faces of the printed circuit board 11, and another binding post 16 formed in a conductive island that is directly incorporated to the other face of the printed circuit board 11. In all of the illustrated embodiments, the electronic device 10 has only two binding posts to be connected to the external system (not illustrated), but it should be understood that the electronic device 10 may present more than two binding posts to be used in the present electric connection arrangement.

As illustrated in FIG. 1, the present electric connection arrangement comprises a housing 20, in the form of box made of a non-conducting material, such as bakelite, plastic, ceramic, etc. which is dimensioned to receive, in the interior thereof, the electronic device 10. The housing 20 secures, internally, at least two contact elements 21, which are usually electrically connected, by and end attached to the housing 10, with the external system (not illustrated) and which will be seated, each one, in a respective binding post 12a, 16 of the electronic device 10 when the latter is fitted into the housing 20.

In the embodiment of FIGS. 1 and 1a, the contact elements 21 each take the form of a laminar spring, with a first portion 21a being affixed to the housing 20 and electrically coupled to the external system by means of adequate conductors (not illustrated), and with a second portion 21b usually with the shape of a convex arc, to be seated against a respective binding post 12a, 16 of the electronic device 10.

With the construction above, when the electronic device 10 is introduced into the housing 20, the contact elements 21 are elastically deformed from an inoperative rest position, to an operative position in which they press the respective binding post 12a, 16 of the electronic device 10.

In the embodiments in which the binding posts are located in opposite faces of the printed circuit board 11, pressing of a contact element 21 on the respective binding post 12a, 16 helps pressing the other binding post against the respective contact element 21, such as illustrated in FIGS. 1, 1a, 4, and 5.

In order to help positioning the electronic device 10 within the housing 20, the latter may incorporate, internally, a guide means 23 in the form of a groove to receive a respective extension of a lateral or end edge of the printed circuit board 11.

Figure 2:
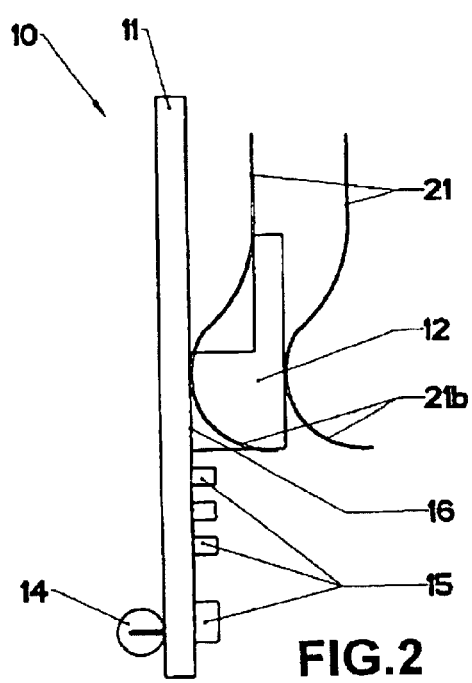
FIG. 2 is a schematic lateral elevational view of the electric connection arrangement between an electronic device and a pair of partially illustrated corresponding contact elements, in accordance with a second embodiment of the invention.

In the embodiment illustrated in FIG. 2, both binding posts 12a, 16 are situated on the same side of the printed circuit board 11, one of the binding posts being defined by the external surface 12a of a power electronic component 12 and the other binding post being defined by a conductive island incorporated to the adjacent face of the printed circuit board 11 which, in this case, is supported, by the opposite face or by its lateral edges, by stop means (not illustrated) provided in the housing 20 to permit the elastic deformation of the contact elements 21 to occur upon introduction of the electronic device 10 inside the housing 20. In this embodiment, both contact elements 21 are elastically deformable and provided on the same side of the printed circuit board 11, forcing the electronic device 10 against the stop means provided in the housing 20.

Figure 3:
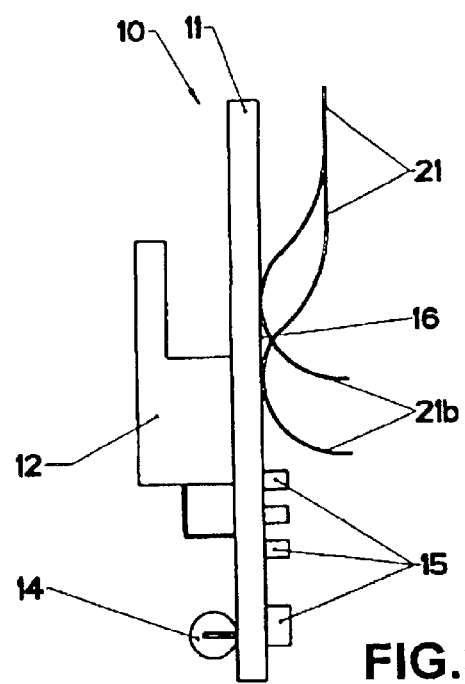
FIGS. 3, 4 and 5 are similar views to that of FIG. 2, but partially illustrating the electric connection arrangement in accordance with a third, a fourth and a fifth embodiment of the invention.

The embodiment illustrated in FIG. 3 is similar to that of FIG. 2, with the difference that both binding posts 16 are defined by respective conductive islands incorporated to the same face of the printed circuit board 11.

Figure 4:
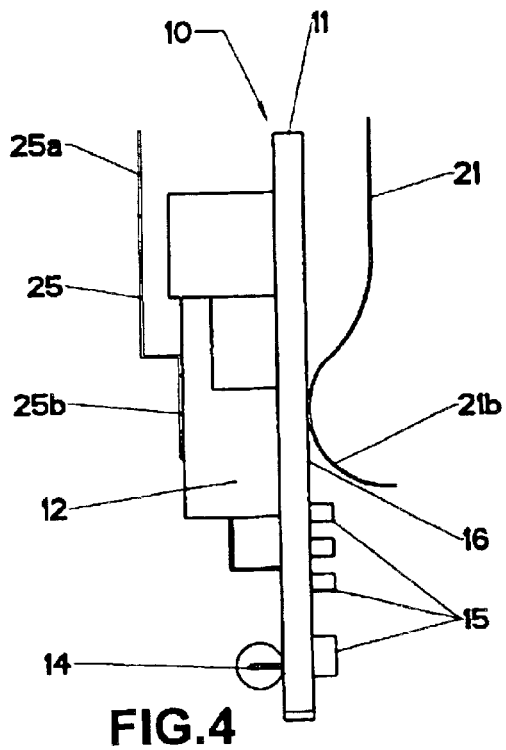
Figure 5:
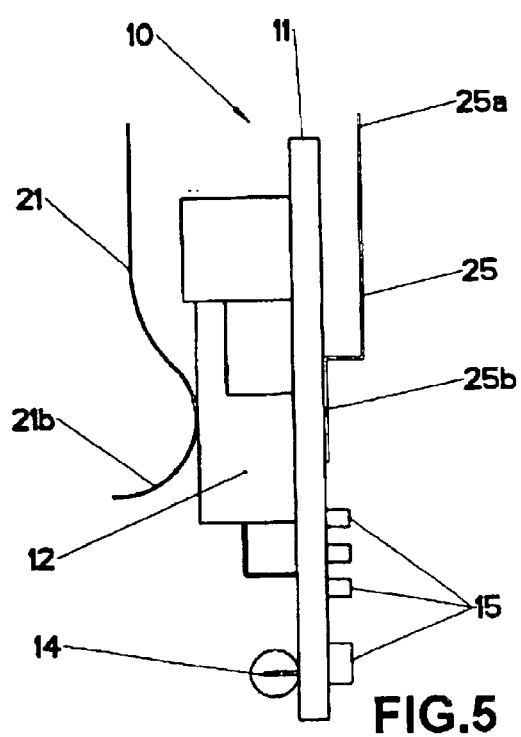

The embodiments illustrated in FIGS. 4 and 5 are similar to that illustrated in FIGS. 1 and 1a, with the difference that one of the contact elements take the form of a conductive rod 25 of low flexibility and having a first portion 25a attached to the housing 20 and a second portion 25b to be seated against a respective binding post 12a, 16 of the electronic device 10. In these last two embodiments, the electronic device 10 has at least one binding post on each side of the printed circuit board 11.

As it can be noted, the electric connection arrangement of the invention can be applied to printed circuit boards with a simple face, reducing the amount of components since it allows eliminating the usual connectors mounted to the plate. Since the space designed to the usual terminals, to the tracks of large dimension, and to the installations between the tracks and conductive islands is reduced, the size of the printed circuit board can be substantially reduced.

The contact element, upon being seated on the heat radiating external surface 12a of the power electronic component 12, allows for a better heat exchange, with said contact element 21 radiating heat to the exterior of the electronic device 10.

Since in the assembly of equipments the connectors are critical elements, the reduced number of components of the arrangement proposed herein allows obtaining a very simplified assembly process, reducing manufacture and assembly costs.

Specific features of the invention are shown in the figures of the drawings for convenience only, as each feature may be combined with other features in accordance with the present invention. Alternative embodiments will be construed as possible by those skilled in the art and are intended to be included in the scope of the claims. Thus, the description above should be construed as illustrative and not limitative of the protective scope of the invention. All obvious alterations and modifications are within the protection defined by the appended claims.

What is claimed is:

1. An electric connection arrangement for electronic devices comprising:

a printed circuit board carrying at least one electronic component and at least two binding posts to be electrically connected to an external system that will be operatively associated with the electronic device;

a housing made of a non-conducting material that is internally provided with contact elements electrically coupled to the external system and which are to be seated, each one to a respective binding post of the electronic device, when the electronic device is fitted into the housing;

at least one of said contact elements being seated, by elastic deformation, against the respective binding post of the electronic device;

one of the binding posts is located on an external surface of an electronic power component and the external surface is electrically coupled to a terminal of the electronic power component; and another of the binding posts is formed from a conductive island present on the printed circuit board.

2. The electric connection arrangement as set forth in claim 1, characterized in that the contact element (21), which is subject to elastic deformation, forces the electronic device (10) to press at least another contact element (21,25) against the respective binding post (12a, 16).

3. The electric connection arrangement as set forth in claim 1, characterized in that the binding posts (12a, 16) of the electronic device (10) are located on the same side of the printed circuit board (11).

4. The electric connection arrangement as set forth in claim 1, wherein the external surface portion is a heat dissipating base of the power electronic component.

5. The electric connection arrangement as set forth in claim 1, characterized in that each contact element (21), subject to elastic deformation, is defined by a laminar spring, with a first portion (21a) affixed to the housing (20) and with a second portion (21b) to be seated against a binding post (12a, 16) of the electronic device (10).

6. The electric connection arrangement as set forth in claim 1, characterized in that the contact elements (21) comprise, besides at least one contact element (21) subject to elastic deformation, at least one contact element (25) in the form of a conductive rod of low flexibility, which has a first portion (25a) attached to the housing (20) and a second portion (25b) to be seated against a respective binding post (12a, 16).

7. The electric connection arrangement as set forth in claim 1, characterized in that the housing (20) is internally provided with a guide means (23) for the printed circuit board (11).

8. The electric connection arrangement as set forth in claim 1, characterized in that the binding posts (12a, 16) of the electronic device (10) are provided on opposite sides of the printed circuit board (11).

9. The electric connection arrangement as set forth in claim 8, wherein at least one of the binding posts (12a) is an external surface portion of an electronic component mounted on the printed circuit board.

* * * * *

UNITED STATES PATENT AND TRADEMARK OFFICE
CERTIFICATE OF CORRECTION

| | | |
|---|---|---|
| PATENT NO. | : 6,921,273 B2 | Page 1 of 1 |
| APPLICATION NO. | : 10/481968 | |
| DATED | : July 26, 2005 | |
| INVENTOR(S) | : Júlio C. Rodrigues | |

It is certified that error appears in the above-identified patent and that said Letters Patent is hereby corrected as shown below:

On The Title Page, Item (73)

Please delete "Empresa Brasileira de Compressores S.A. – Embarco, Joinville – SC (BR)" and substitute with -- Empresa Brasileira De Compressores S.A. – Embraco, Joinville - SC (BR) --.

Signed and Sealed this

Fifth Day of September, 2006

JON W. DUDAS
*Director of the United States Patent and Trademark Office*